United States Patent
Hsieh (10) Patent No.: US 7,670,166 B2
(45) Date of Patent: Mar. 2, 2010

(54) BURN-IN SOCKET HAVING ROLLER-ACTUATED LATCHING MEMBERS ARRANGEMENT

(75) Inventor: Wen-Yi Hsieh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/154,302

(22) Filed: May 22, 2008

(65) Prior Publication Data

US 2008/0293285 A1  Nov. 27, 2008

(30) Foreign Application Priority Data

May 22, 2007  (CN) .......................... 2007 2 0037866

(51) Int. Cl.
*H01R 13/62* (2006.01)
(52) U.S. Cl. ..................................................... 439/330
(58) Field of Classification Search .................. 439/73, 439/330, 331
See application file for complete search history.

(56) References Cited

U.S. PATENT DOCUMENTS 7,287,997 B2 * 10/2007 Matsuo et al. .............. 439/330

* cited by examiner

*Primary Examiner*—Neil Abrams
(74) *Attorney, Agent, or Firm*—Andrew C. Cheng; Wei Te Chung; Ming Chieh Chang (57) ABSTRACT

An burn-in socket used for connecting an IC package includes an base urged upward by springs, an actuated device floatably assembled on said base, a frame retained on said base, a plurality of contacts received in said base. Said actuated device includes a plurality of sustaining shafts with a plurality of rollers ringed thereon. Said latching assembly includes a plurality of rotating shafts retained on said base and a plurality of latching members engaged with said rotating shafts and rotating between an open position and a locking position. The actuated member when urged upwardly causes to rollers to press on back side faces of the latching members to rotate them between an open position and a closed position with lowered abrasion.

20 Claims, 9 Drawing Sheets

BURN-IN SOCKET HAVING ROLLER-ACTUATED LATCHING MEMBERS ARRANGEMENT

BACKGROUND OF THE INVENTION

1. Field of the Invention

The present invention relates to an electrical connector, and more particularly to a burn-in socket having latching members actuated by a plurality of rollers facilitating efficiency and reducing mechanic loss.

2. Description of Related Art

Conventionally, a burn-in socket mounted for an IC package to various test, in which IC package is loaded into or loaded out frequently for connecting or disconnecting with terminals electrically therein, there has been a socket employing a plurality of latching members biased by a plurality of shafts for retaining the IC package tightly. The latching members are forced by the shafts to open and close in response to loading and retaining the IC package. Said shafts engage with said latching members and are mechanically forced to drive the latching members move. However, in the conventional socket, the shafts need to connect with each other moveably and have a relative motion therebetween, which usually brings out a heavy abrasion and a big loss in efficiency between the shafts. On the other hand, the shafts usually define a complicated structure therebetween and increase the difficulty in operation and assembly. In said conventional burn-in socket, for example, as disclosed in Japanese Patent Publication No. 2003-123926, the socket includes a float cover, four latching members and a plurality of shafts engaged with each latching member. One of said shafts directly engages with said float cover and is pushed downwardly together with the float cover by an exterior operating force thereon, which drives the rest of the shafts shift together to push the latching members upwardly to an open position for loading and unloading an IC package. Furthermore, when the exterior operating force is released off from said float cover, the shafts restore back to an original position, which drives the latching member shift back to a locking position retaining the IC package tightly. In this process, it is understood that there has been a heavy abrasion and big loss in efficiency therebetween with a lower operating efficiency in such a complex structure.

So it is necessary to provide a new burn-in socket to solve the problems above.

SUMMARY OF THE INVENTION

Accordingly, an object of the present invention is to provide a burn-in socket, which has roller-actuated latching members with a simple structure and lower abrasion.

In order to achieve above-mentioned object, a burn-in socket is provided for receiving an IC package which comprises a base defining an electrical contacting area, a plurality of latching members each pivotally assembled to said base adjacent to said electrical contacting area and an actuated device floatably assembled to said base. Said actuated device includes a plurality of rollers each corresponding to each of said latching member and moved from a first position which the latching member are opened, and a second position in which the latching members are closed by the engagement of the rollers.

Other objects, advantages and novel features of the present invention will become more apparent from the following detailed description of the present embodiment when taken in conjunction with the accompanying drawings.

DETAILED DESCRIPTION OF THE INVENTION

The present invention shall be discussed hereinafter in terms of a preferred embodiment illustrated in the accompanying drawings. In the following description, numerous specific details are set forth in order for the reader hereof to gain a thorough understanding of the present invention. It will be obvious, however, to those skilled in the art that certain well-know elements may not be shown in detail in order to unnecessarily obscure the present invention.

Figure 1:
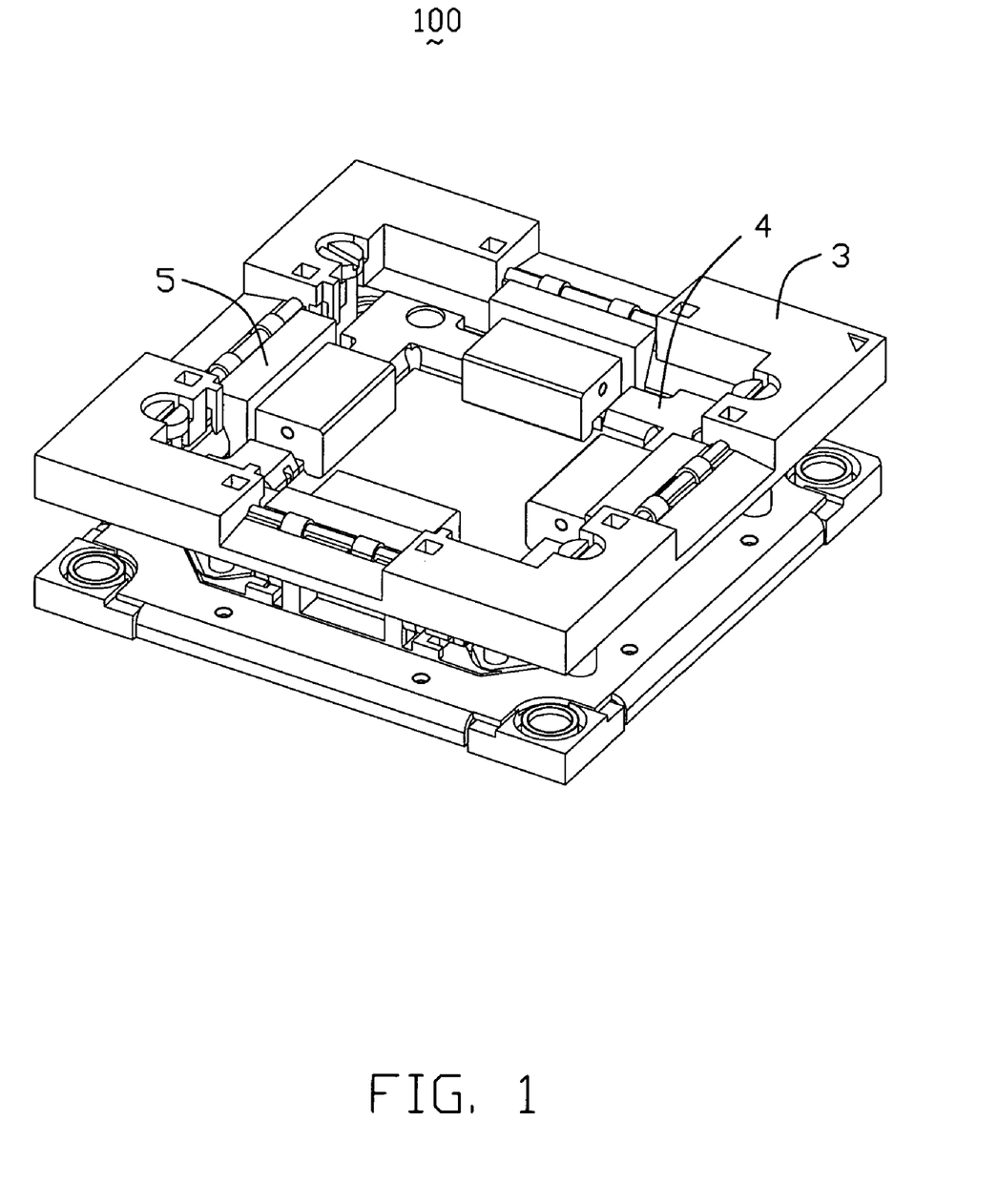
FIG. 1 is an assembled, perspective view of a burn-in socket in accordance with an embodiment of the present invention when the latching member is on a second position.
Figure 2:
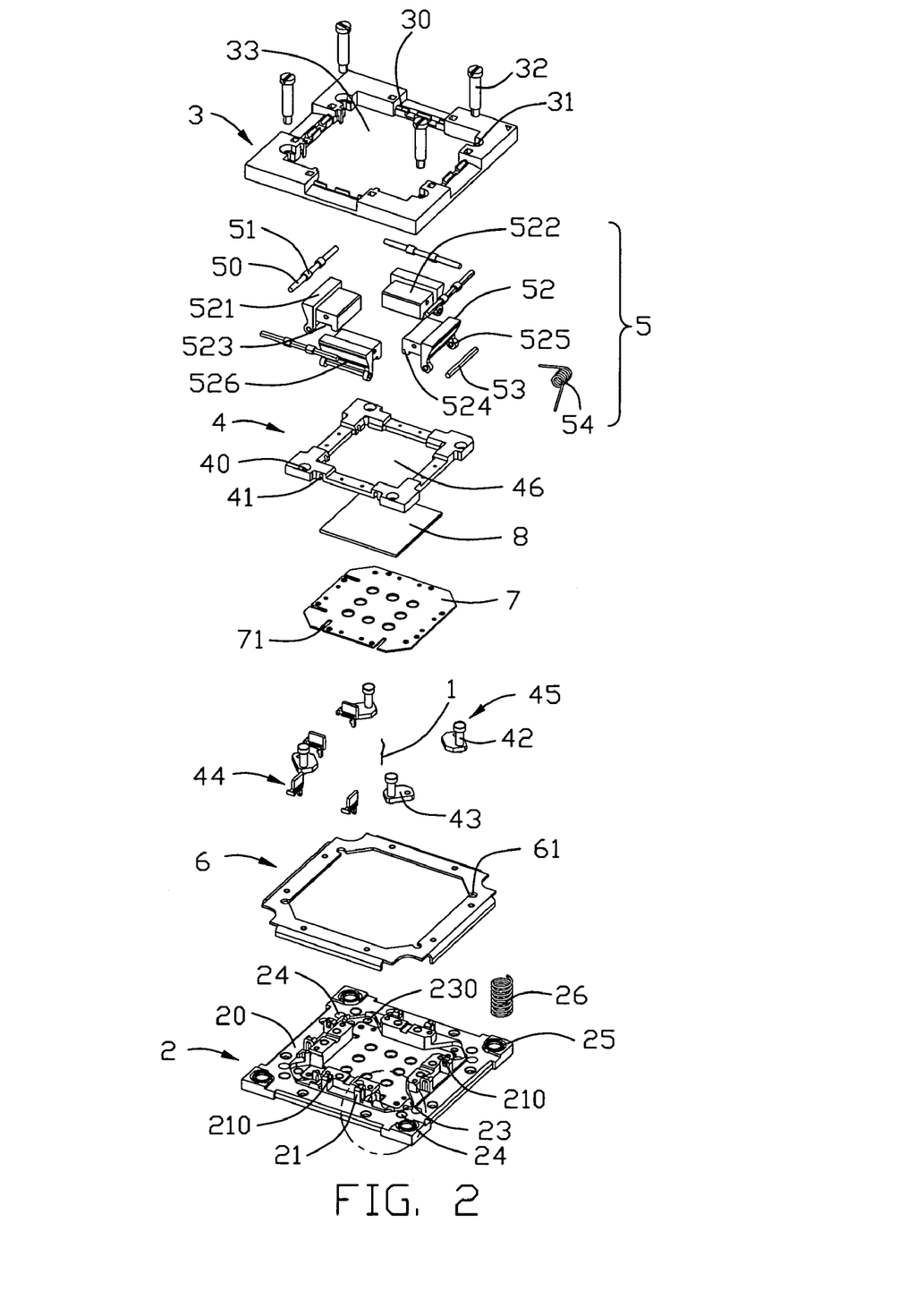
FIG. 2 is an exploded, perspective view of the burn-in socket in accordance with the embodiment of the present invention.

Referring to FIGS. 1 and 2, an burn-in socket 100 in accordance with the present invention is provided for receiving an IC package 8. The burn-in socket 100 comprises a plurality of contacts 1, a square base 2, a actuated device 3 floatably assembled on said square base 2 downwardly, a frame 4 assembled on said base 2, a latching assembly 5, a supporting board 6 for stopping said actuated device 3 downwardly, a spacer 7 for receiving said contacts 1 and a bottom plate (not labeled). A latching member 62 of said latching assembly 5 rotates between a first position and a second position impelled by a motion of said actuated device 3. When the latching member 52 reaches to said first position which the latching assembly 5 is opened, the IC package 8 can be assembled into said burn-in socket 100. After the latching member 52 rotates to said second position which the latching assembly 5 is closed, said IC package 8 can be retained in the burn-in socket 100 tightly. Only one contact 1 is shown in FIG. 2 for simplicity.

Figure 9:
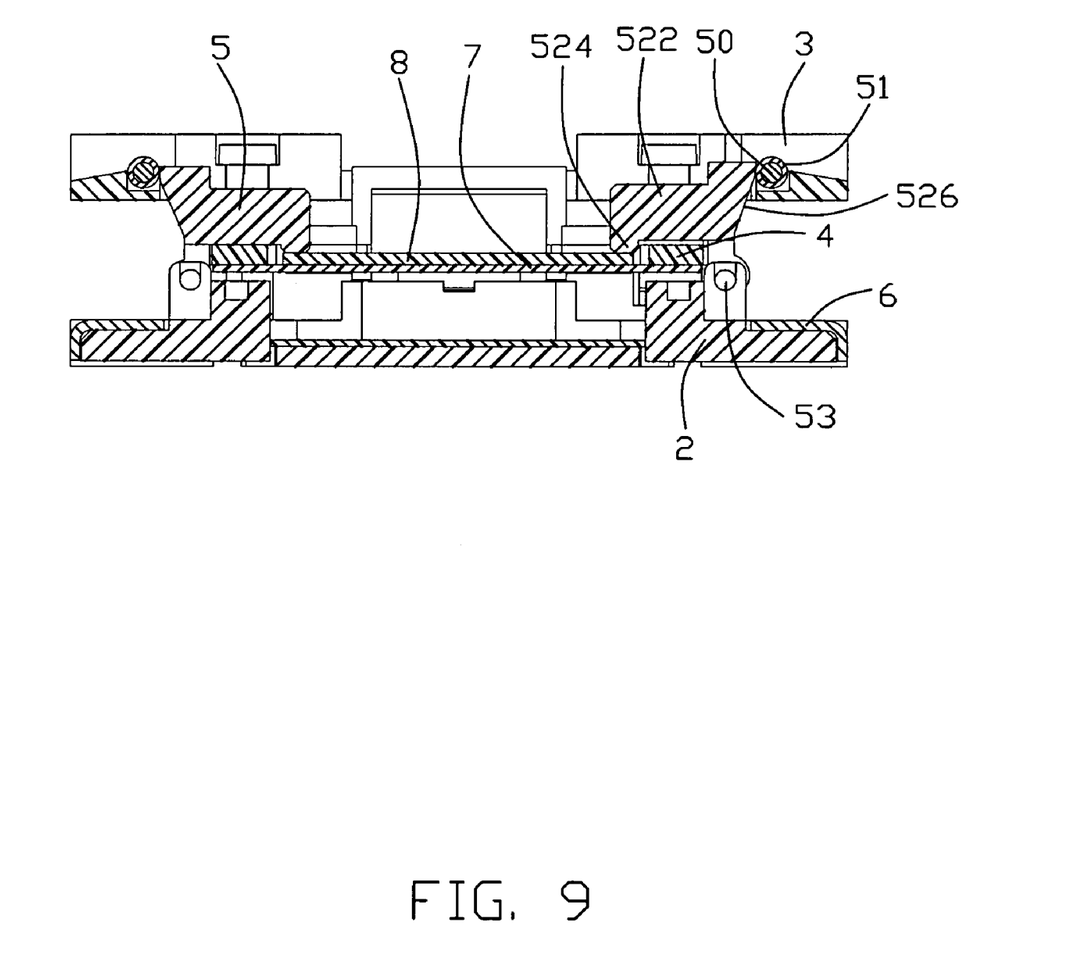
FIG. 9 is cross-sectional view of FIG. 8 taken along line 9-9.

Referring to FIG. 2, the base 2 is formed with insulating materials by insert-molding. Said base 2 includes a square main body 20 and a plurality of upward portions which will be described hereinafter, extending upwards from the main body with a centre receiving room 23 therebetween. The main body 20 defines four apertures 25 on four corners respectively for receiving four vertical springs 26 for supporting said actuated device 3 vertically. The metal supporting board 6 with a larger centre opening covers on the base 2, wherein said upward portions run though the larger opening (as best shown in FIG. 9).

Figure 3:
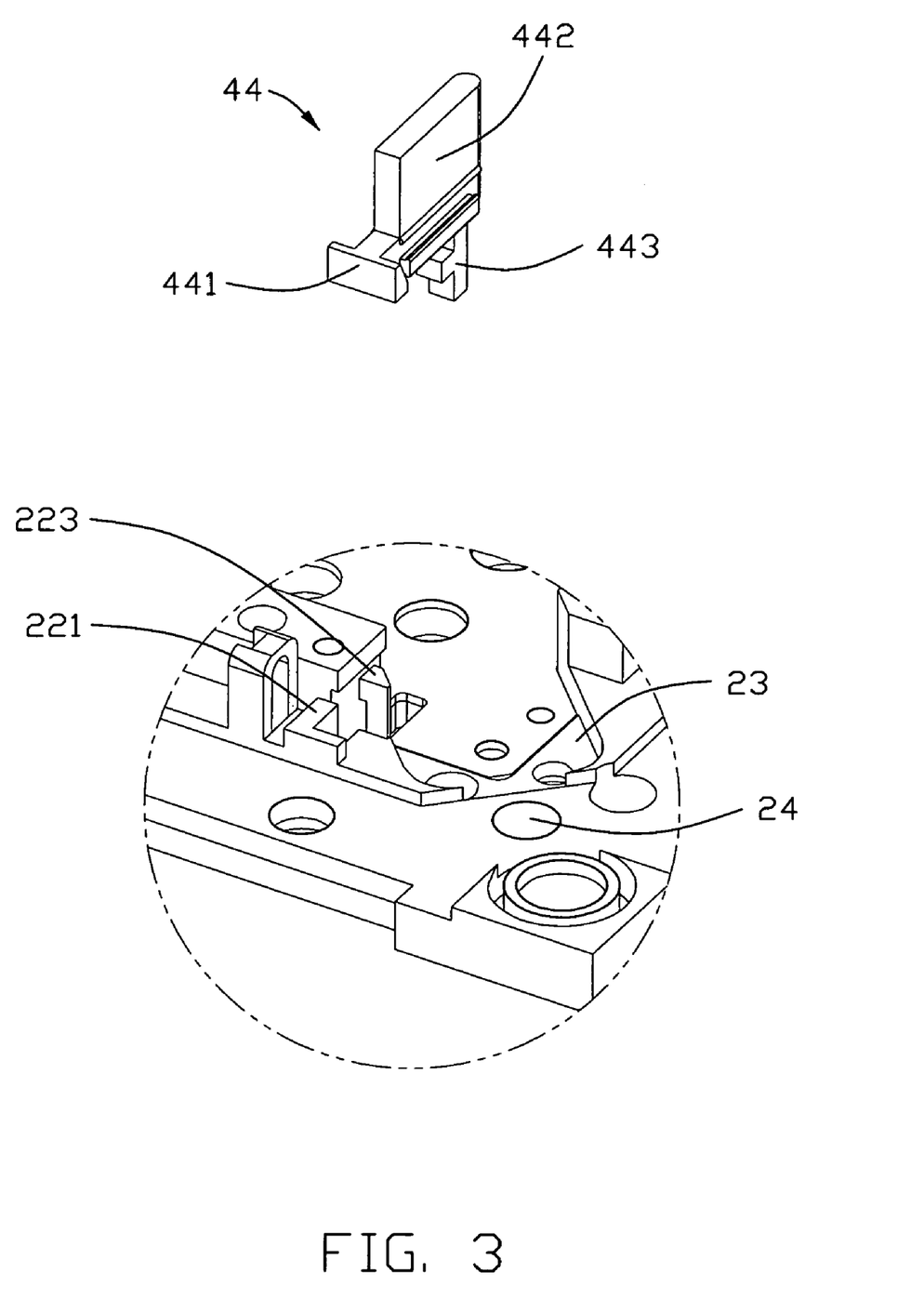
FIG. 3 is a partial enlarged view of the base and the second retaining member shown in FIG. 2.
Figure 4:
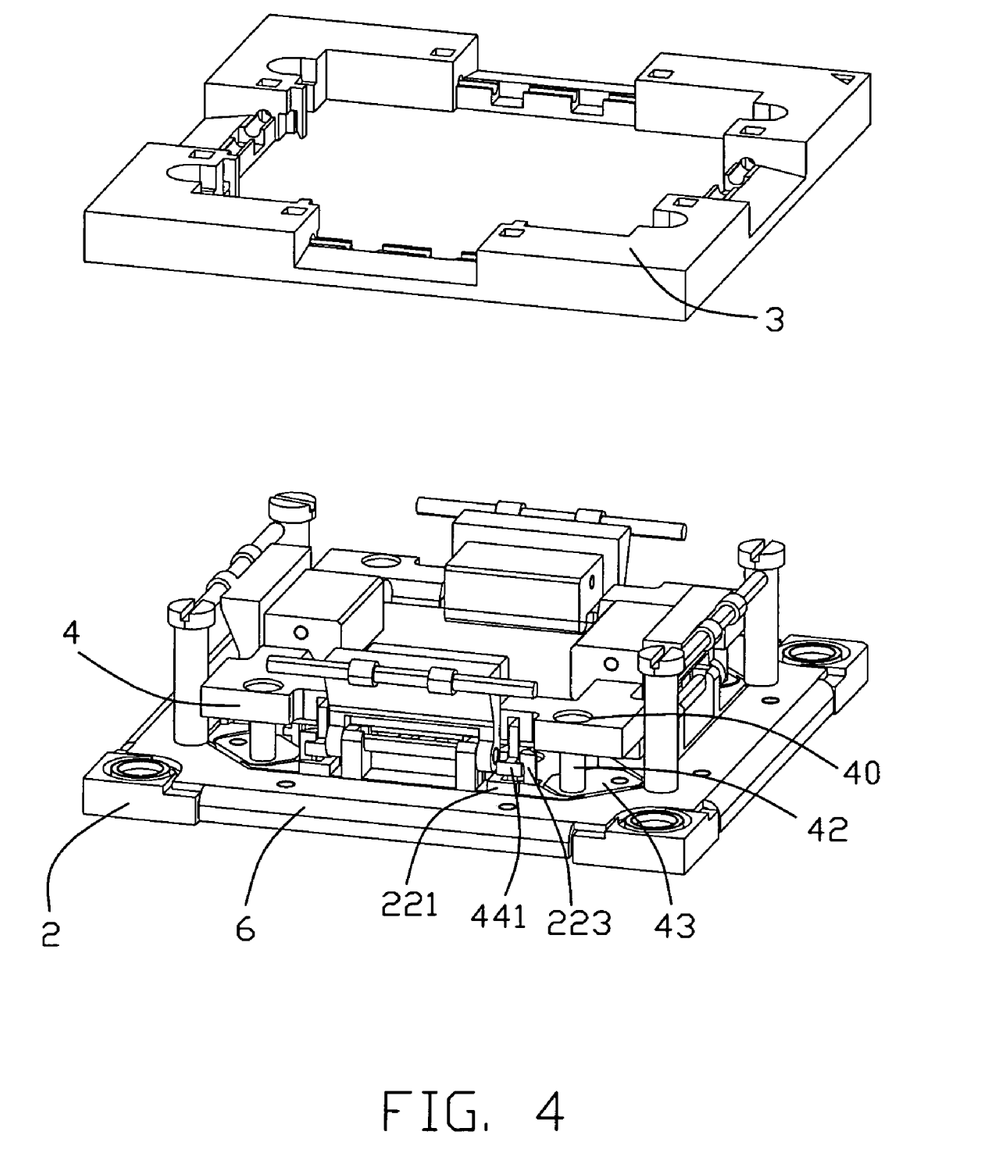
FIG. 4 is an partial assembled, perspective view of the burn-in socket without showing the vertical springs on the base and the springs on the rotating shafts.
Figure 5:
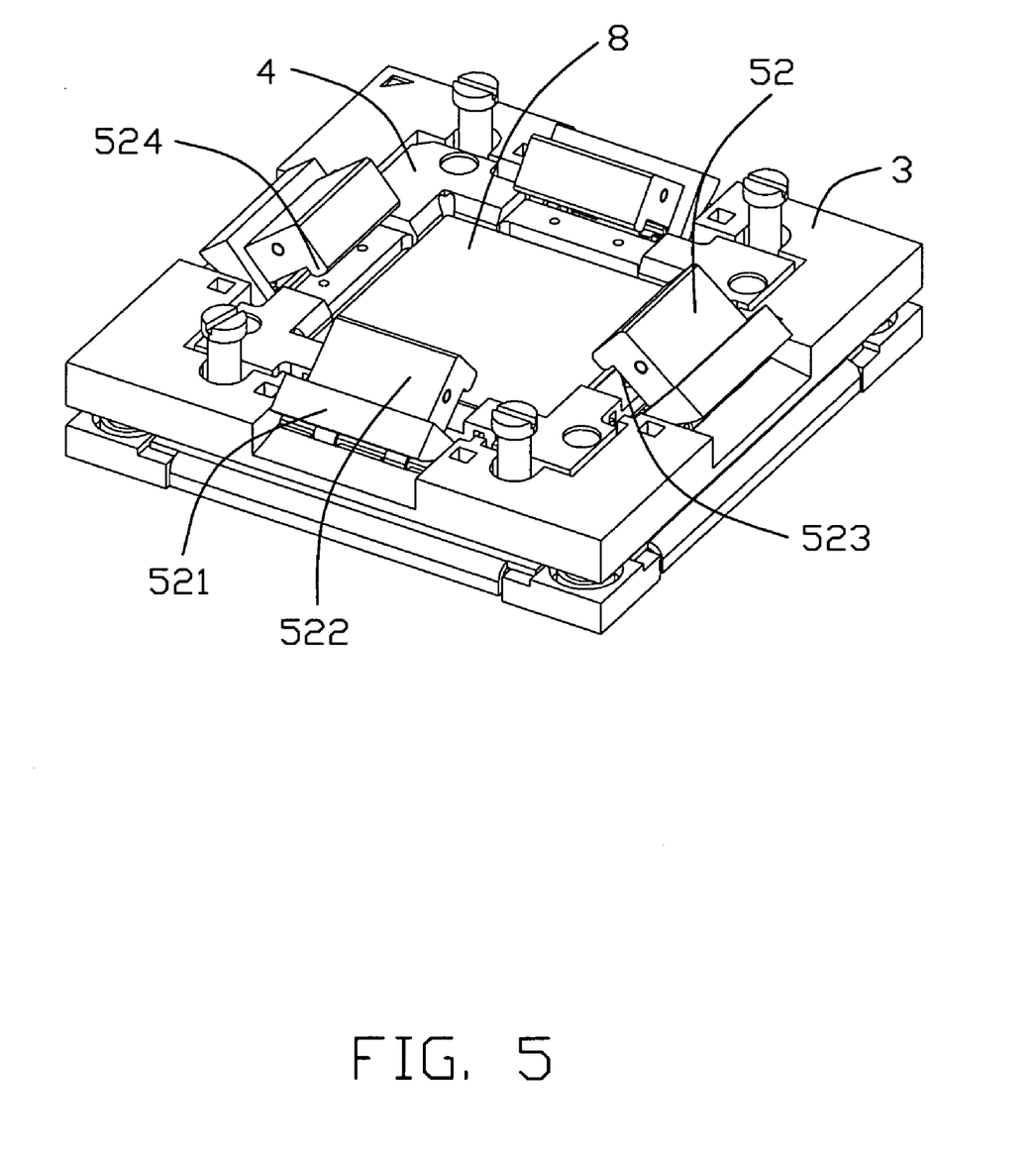
FIG. 5 is an another assembled, perspective view of the burn-in socket in FIG. 4, showing the latching member on a first position.
Figure 6:
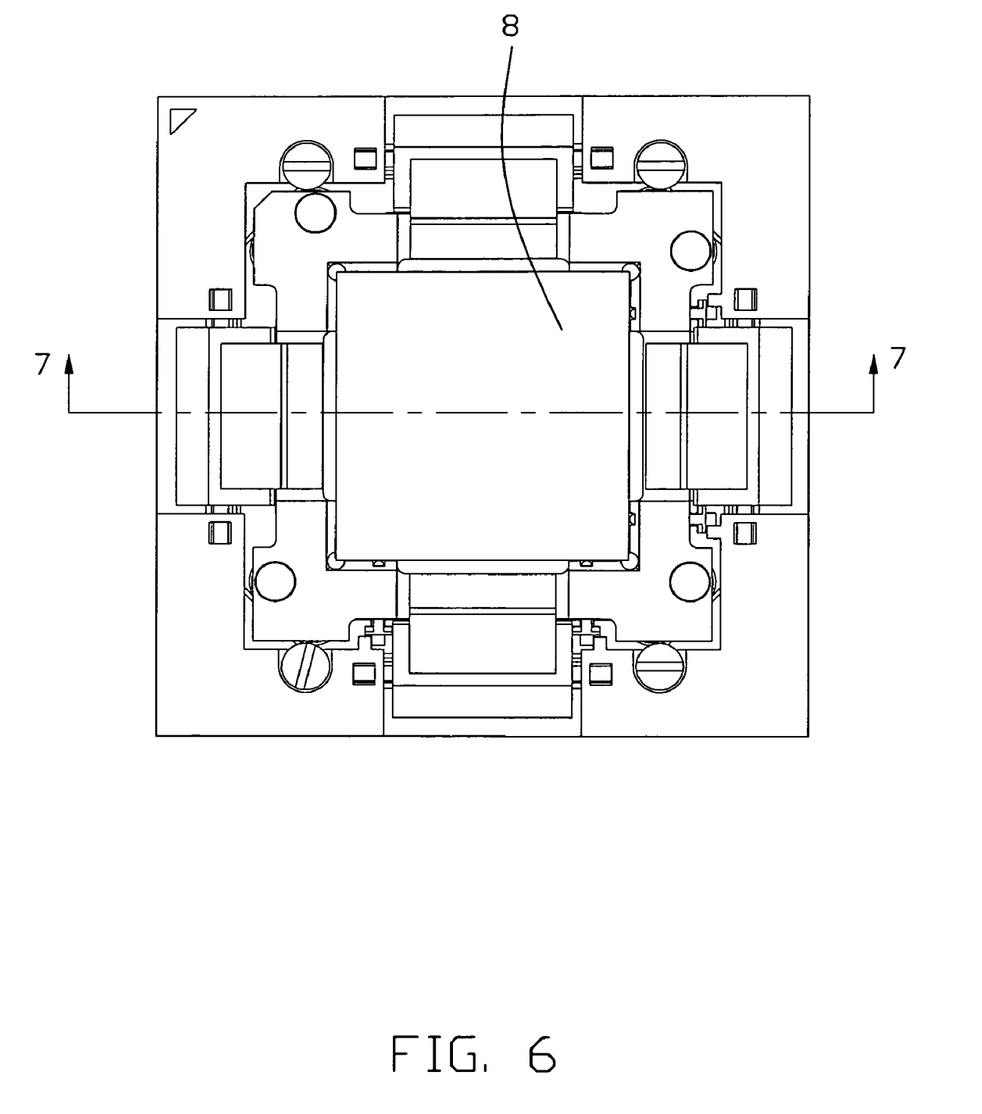
FIG. 6 is top side view of the burn-in socket in FIG. 5, showing the latching member on a first position.
Figure 7:
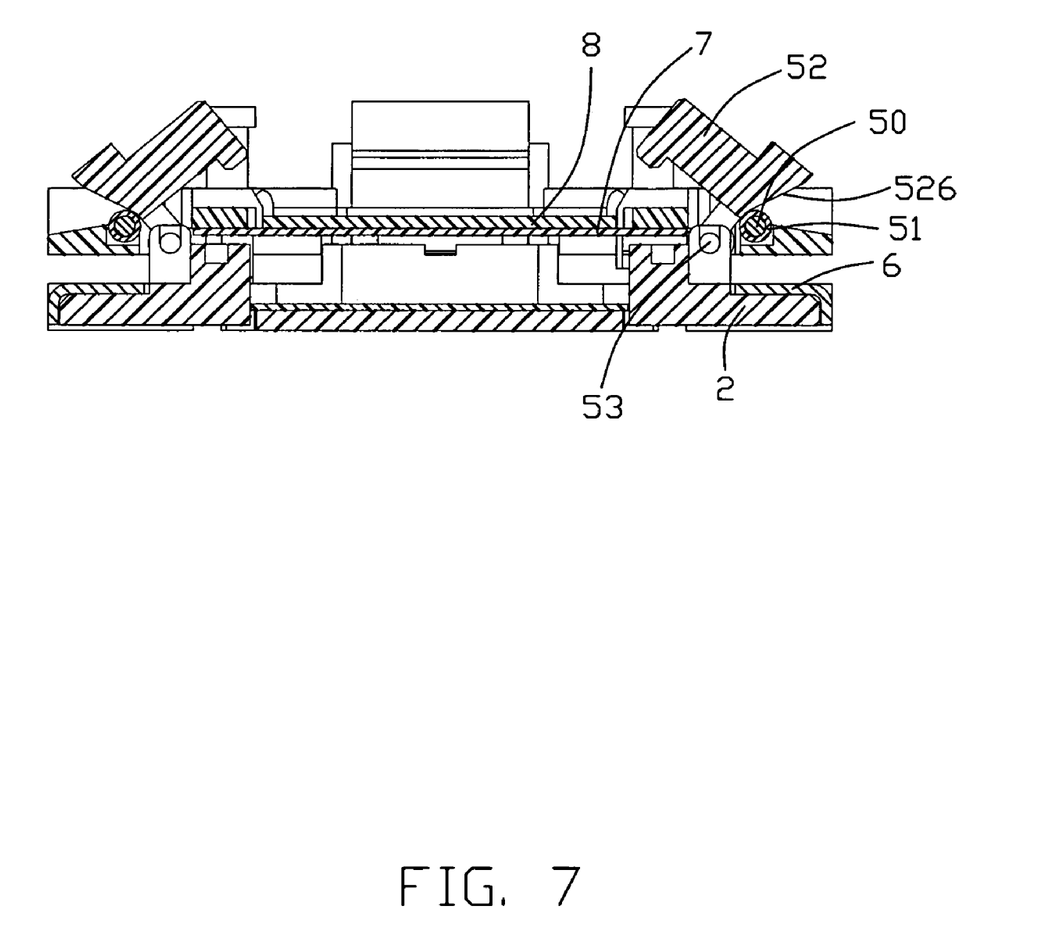
FIG. 7 is cross-sectional view of FIG. 6 taken along line 7-7.
Figure 8:
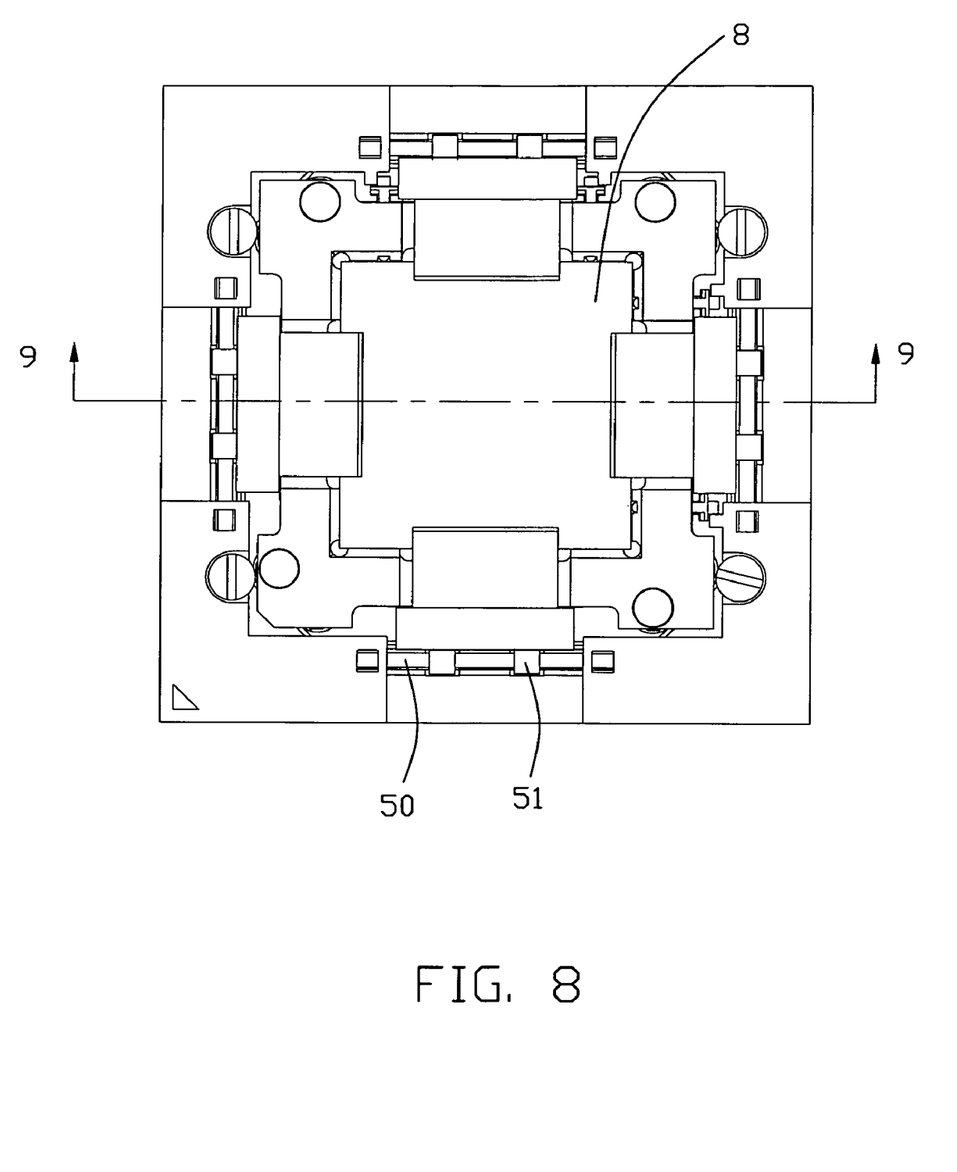
FIG. 8 is top side view of the burn-in socket in FIG. 1, showing the latching member on a second position.

The spacer 7 and the frame 4 are assembled on the base 2 to support the IC package 8, which is retained by four retaining member 44 and 45. Each first retaining member 45 has a retaining portions 43 retained in the corner of receiving room 23 and an upright post portion 42 received in corresponding hole 40 defined in the four corners of the frame 4, which is best shown in FIG. 4. The two pairs of the second retaining members 44 are located at two adjacent sides of the centre receiving room 23. As best shown in FIG. 3, each second retaining member 44 includes an upright vertical portion 442, a downward vertical portion 443 and a horizontal portion 441. Said downward vertical portion 443 is retained in the receiving room 23 by a pair of locking bar 221, 223 integrally extending from the main body 20. Said upright vertical portions 442 engage with retaining slots 71 defined at two adjacent side edges of the spacer 7 and vertical slots 41 defined on corresponding side walls of the frame 4 so that the frame 4 and the spacer 7 are assembled over the receiving room 23. The contacts 1 run through the spacer 7 into a centre opening 46 defined in the centre of the frame 4.

Said upward portions of the base 2 extending upward from the main body are arranged in square form and each includes a pair of spaced supporting posts 21 extending upwardly from the main body 20 and adjacent to the locking bars 221, 223. Each supporting post 21 has a first shaft hole 210 thereon for being used to assemble the latching assembly 5 on the base 2.

The latching assembly 5 is used to unlock said IC package 8 by pushing said actuated device 3 downwardly. Said latching assembly 5 includes four couples arranged in square form. The actuated device 3 is of a square frame and has four sidewalls with a lager centre opening 33 and a plurality of sustaining shafts 50 retained on said sidewalls. Each sidewall has a horizontal semicircle shaft slot 30 opening upward and two semicircle holes 31 opening to the lager centre opening 33 on two opposite inner edges thereof. Each sustaining shaft 50 is received in said horizontal semicircle shaft slot 30 and includes at least one roller 51 rotatable ringed thereon.

Each couple includes a latching member 52 corresponding to said sustaining shaft 50 and a rotating shaft 53 pivotally assembled on said base 2. Each latching member 52 has a pressing portion 521 with a pair of second shaft holes 525 at two opposite bottom ends thereof and a locking portion 522 extending inwardly from said pressing portion 521. The second shaft hole 525 is used to receive the rotating shaft 53 which is ringed with a spring 54. The rotating shaft 53 then is assembled into the first shaft hole 210 of the supporting post 21 of the base 2 as best shown in FIG. 4 so that the latching member 52 is assembled on the base 2 and the spring 54 can push the latching member 52 rotate around the rotating shaft 53. The locking portion 522 defines a groove 523 engaging with said frame 4 as best shown in FIG. 9 and a pressing bar 524 for pressing said IC package 8. Said pressing portion 521 has a slanted surface 526 formed on the back side face of the pressing portion 521 for engaging with said sustaining shaft 50. The latching member 52 rotates around the rotating shaft 53 between the first position and second position while the slanted surface 526 is sustained by said sustaining shaft 50.

Four bolts 32 run through the four semicircle holes 31 of the actuated device 3, four gaps 61 defined on four corners of the supporting board 6 and are retained, with one end, in the holes 230 defined on the main body of the base 2

The burn-in socket 100 uses said latching assembly 5 to avoid a heavy abrasion during the latching member 52 rotates between the first position and the second position. When said actuated device 3 is pressed downwards to said base 2, the vertical springs 26 are compressed downwardly and said sustaining shafts 50 move downwardly with the actuated device 3, at the same time, said latching members 52 are pushed by the springs 54 on a bottom face thereon to rotate outwardly around the rotating shafts 53. During this process, said slanted surface 526 of each latching member 52 is moveable sustained by said rollable roller 51 which brings out a lower abrasion therebetween. Conversely, the actuated device 3 is shifted upwardly by restoring of said vertical springs 26 when the exterior on the actuated device 3 is withdrawn, the sustaining shafts 50 and the rollers 51 are shifted upwardly with said actuated device 3 together, which pushes the slanted surfaces 526 upwardly and makes the latching members 52 rotate inwardly around the rotating shafts 53 to said locking position. The latching members 52 rotate between said open position and locking position by said rollable rollers 51, which lowers the abrasion and improves the operating efficiency and simplifies the latching assembly 5.

However, while the preferred embodiment of the invention has been shown and described, it will apparent to those skilled in the art that changes and modifications may be made therein without departing from the spirit of the invention, the scope of which is defined by the appended claims.

What is claimed is:

1. A burn-in socket, comprising:
a base defining an electrical contacting area;
a plurality of latching members each pivotally assembled to said base adjacent to said electrical contacting area;
an actuated device floatably assembled to said base, and including a plurality of rollers each corresponding to each of said latching member, and moved from a first position which the latching member are opened, to a second position in which the latching members are closed by the engagement of the rollers.

2. The socket as recited in claim 1, wherein said latching member defines a contour on which said rollers move from the first position to the second position.

3. The socket as recited in claim 2, wherein said latching member has a slanted surface formed as said contour thereof moveably engaging with said rollers.

4. The socket as recited in claim 3, wherein said actuated device further includes a plurality of sustaining shafts retained on sidewalls thereof and each having at least one said roller rollably ringed thereon.

5. The socket as recited in claim 4, wherein said latching member has a rotating shaft assembled on said base, the latching member rotates around said rotating shaft while the roller rollably engages with said slanted surface simultaneously.

6. The socket as recited in claim 5, wherein said sustaining shaft and roller shift vertically to the first position while the slanted surface is moveably sustained by the roller and the latching member rotates outwardly.

7. The socket as recited in claim 3, wherein said base includes a plurality of vertical springs retained on four corners thereof for sustaining said actuated device upwardly between said first position and second position.

8. The socket as recited in claim 7, wherein said burn-in socket further includes a plurality of rotating shafts each with a spring ringed thereon for sustaining said latching member outwardly between said first position and second position.

9. The socket as recited in claim 8, wherein said vertical springs of the base are compressed downwardly while the springs of rotating shafts restores.

10. The socket as recited in claim 1, wherein said base includes a plurality of vertical springs retained on four corners thereof sustaining said actuated device resiliently.

11. An electrical connector comprising:
a base having a main body defining a receiving room;
a plurality of contacts retained in said base and extending into said receiving room;

an actuated device including a plurality of sustaining shafts with a plurality of rollable rollers ringed thereon;

a plurality of latching members rotationally assembled on said base and sustained by said sustaining shafts; wherein said actuated device shifts vertically so that said rollers rollably drive said latching members to rotate around the sustaining shafts, the latching member generates a downward pressing force on the sustaining shaft during the rotation itself.

12. The electrical connector as recited in claim 11, wherein each latching member has a slanted surface moveably sustained by said rollers.

13. The electrical connector as recited in claim 12, wherein said sustaining shafts are retained on four sidewalls of the actuated device and shift vertically while the slanted surfaces rotate outwardly.

14. The electrical connector as recited in claim 11, wherein both said actuated device and latching member are sustained by springs respectively on a bottom surface thereon.

15. An electrical connector comprising:

a base with a receiving room for receiving an electronic package;

a cover up and down moveable relative to the base in a vertical direction;

a latch member pivotally mounted upon the base; and a roller mounted to the cover; wherein the roller engages a bottom face of the latch member to urge the latch member toward the receiving room to lock said electronic package in the base.

16. The electrical connector as claimed in claim 15, wherein the bottom face includes mainly a slanted region.

17. The electrical connector as claimed in claim 16, wherein the bottom face further includes a vertical region above said slanted region.

18. The electrical connector as claimed in claim 15, wherein engagement between the roller and the bottom surface occurs in a horizontal direction when said latch member is located in a locking position to lock said electronic package in the base.

19. The electrical connector as claimed in claim 18, wherein said engagement occurs at an upper portion of the bottom surface when said latch member is located in the locking position.

20. The electronic connector as claimed in claim 15, wherein engagement between the roller and the bottom surface occurs in an up-and-down direction when said latch member is located in a unlocking position to unlock the electronic package from the base.

* * * * *